(12) United States Patent
Craft, Jr. et al.

(10) Patent No.: US 11,592,638 B2
(45) Date of Patent: Feb. 28, 2023

(54) HEAT MANAGEMENT SYSTEMS FOR ENCLOSURES FOR POWER AND OPTICAL FIBER NETWORKS

(71) Applicant: CommScope Technologies LLC, Hickory, NC (US)

(72) Inventors: Thomas F. Craft, Jr., Murphy, TX (US); Willis F. James, Wylie, TX (US); Thomas G. Leblanc, Westminster, MA (US); Gary L. Guilliams, Hayes, VA (US); Carlos Jair Briceno, Chihuahua (MX); Thomas A. Thigpen, Highland Village, TX (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 39 days.

(21) Appl. No.: 17/328,443

(22) Filed: May 24, 2021

(65) Prior Publication Data
US 2021/0373268 A1 Dec. 2, 2021

Related U.S. Application Data

(60) Provisional application No. 63/031,627, filed on May 29, 2020.

(51) Int. Cl.
*G02B 6/44* (2006.01)
*H01B 9/00* (2006.01)
(Continued)

(52) U.S. Cl.
CPC ......... *G02B 6/4454* (2013.01); *G02B 6/4441* (2013.01); *H01B 9/005* (2013.01); *H04Q 1/035* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 5,930,111 A | * | 7/1999 | Yamazaki | H04Q 1/026 250/227.24 |
| 10,028,414 B2 | | 7/2018 | Khandelwal et al. | |
| 10,353,163 B1 | * | 7/2019 | Hanks | G02B 6/4448 |

(Continued)

FOREIGN PATENT DOCUMENTS

| | | |
|---|---|---|
| CN | 107678115 A | 2/2018 |
| JP | 2004320633 A | 11/2004 |

(Continued)

OTHER PUBLICATIONS

"International Search Report and Written Opinion of the International Searching Authority", International Application No. PCT/US2021/033869, dated Oct. 21, 2021, 17 pp.

(Continued)

*Primary Examiner* — Chad H Smith
(74) *Attorney, Agent, or Firm* — Myers Bigel, P.A.

(57) ABSTRACT

A thermal management system for a power and fiber splice enclosure that includes a housing including electrical components is provided. The thermal management system includes a solar shield disposed external to the housing and covering at least a major portion of the housing. The thermal management system includes a vent disposed in the housing for venting hot air from the enclosure. The thermal management system includes a condenser thermally coupled to a heat conducting component of the enclosure for cooling at least the heat conducting component.

17 Claims, 9 Drawing Sheets

(51) Int. Cl.
  *H04Q 1/02* (2006.01)
  *H05K 7/20* (2006.01)

(56) References Cited

U.S. PATENT DOCUMENTS

| | | | |
|---|---|---|---|
| 10,770,203 B2 | 9/2020 | Craft et al. | |
| 2002/0174671 A1* | 11/2002 | Wilkinson | F24F 1/58 62/428 |
| 2006/0204393 A1 | 9/2006 | Sobel et al. | |
| 2007/0115635 A1 | 5/2007 | Low et al. | |
| 2007/0171600 A1* | 7/2007 | Pedoeem | H05K 7/20009 361/600 |
| 2008/0291627 A1 | 11/2008 | Fischer et al. | |
| 2014/0054021 A1* | 2/2014 | Xing | F28D 15/0266 165/185 |
| 2020/0002026 A1* | 1/2020 | Duong | F28D 15/0241 |
| 2020/0027629 A1 | 1/2020 | Craft et al. | |

FOREIGN PATENT DOCUMENTS

| | | | |
|---|---|---|---|
| JP | 2005150401 A | 6/2005 | |
| WO | 9741472 A1 | 11/1997 | |
| WO | 2018017544 A1 | 1/2018 | |
| WO | 2020040913 A1 | 2/2020 | |

OTHER PUBLICATIONS

"Invitation to Pay Additional Fees and, Where Applicable, Protest Fee", International Application No. PCT/US2021/033869, Aug. 25, 2021, 11 pp.

COMMSCOPE , "Heliax® FiberFeed Hybrid Cable, Fiber + Power Connectivity, Single-Cable Power and Fiber Solution", Tray Rated Remote Radio Hybrid with Corrugated Aluminum Shield, Fiber Cable: Two 12-fiber Subunits, Copper Conductors: 6X6AWG THWN/ THHN and Two 18AWG Copper Conductors, NEC Type: (UL) and c(UL) Type TC-ER, Jun. 27, 2013, 1 p.

COMMSCOPE , "Heliax® FiberFeed Hybrid Cable, Fiber + Power Connectivity, Single-Cable Power and Fiber Solution", Tray Rated Remote Radio Hybrid with Corrugated Aluminum Shield, Fiber Cable: Three 12-fiber Subunits, Copper Conductors: 10X6AWG THWN/THHN and Two 18AWG Copper Conductors, NEC Type: (UL) and c(UL) Type TC-ER, Aug. 15, 2013, 1 p.

COMMSCOPE , "Heliax® FiberFeed® Hybrid Cable, Fiber + Power Connectivity, Single-Cable Power and Fiber Solution", Tray Rated Remote Radio Hybrid with Corrugated Aluminum Shield, Fiber Cable: Two 12-fiber Subunits, Dopper Conductors: 12X6AWG THWN/THHN and 18X18AWG Alarm Wires, NEC Type: (UL) and c(UL) Type TC-ER, Feb. 25, 2014, 1 p.

* cited by examiner

HEAT MANAGEMENT SYSTEMS FOR ENCLOSURES FOR POWER AND OPTICAL FIBER NETWORKS

CROSS-REFERENCE TO RELATED APPLICATION

The present application claims priority to U.S. Provisional Patent Application Ser. No. 63/031,627, filed May 29, 2020, the entire content of which is incorporated herein by reference.

FIELD

The present disclosure relates to communication systems and, in particular, to enclosures for optical fiber.

BACKGROUND

In many information and communication technology systems, network-connected electronic devices are deployed in locations where a local electric power source is not available. With the proliferation of the Internet of Things ("IoT"), autonomous driving, fifth generation ("5G") cellular service, and the like, it is anticipated that network-connected electronic devices will increasingly be deployed at locations that lack a conventional electric power source.

Electric power may be provided to such remote network-connected electronic devices in numerous ways. One technology for delivering power to such remote network-connected electronic devices is power-plus-fiber cables. Power-plus-fiber cables are a type of composite power-data cable that includes both power conductors and optical fibers within a common cable jacket. Data/power grids are being deployed that have enclosures for power and fiber optic cables. Such data/power grids may route both power cables and fiber optic cables to these enclosures to enable one or more tap offs (e.g., drops) for power connections and also one or more tap offs for fiber data connections for communications devices, such as cellular radios. The enclosure may also function as a pass-through port so that a plurality of nodes may be coupled together in a "daisy chain" manner.

DETAILED DESCRIPTION

Figure 1:
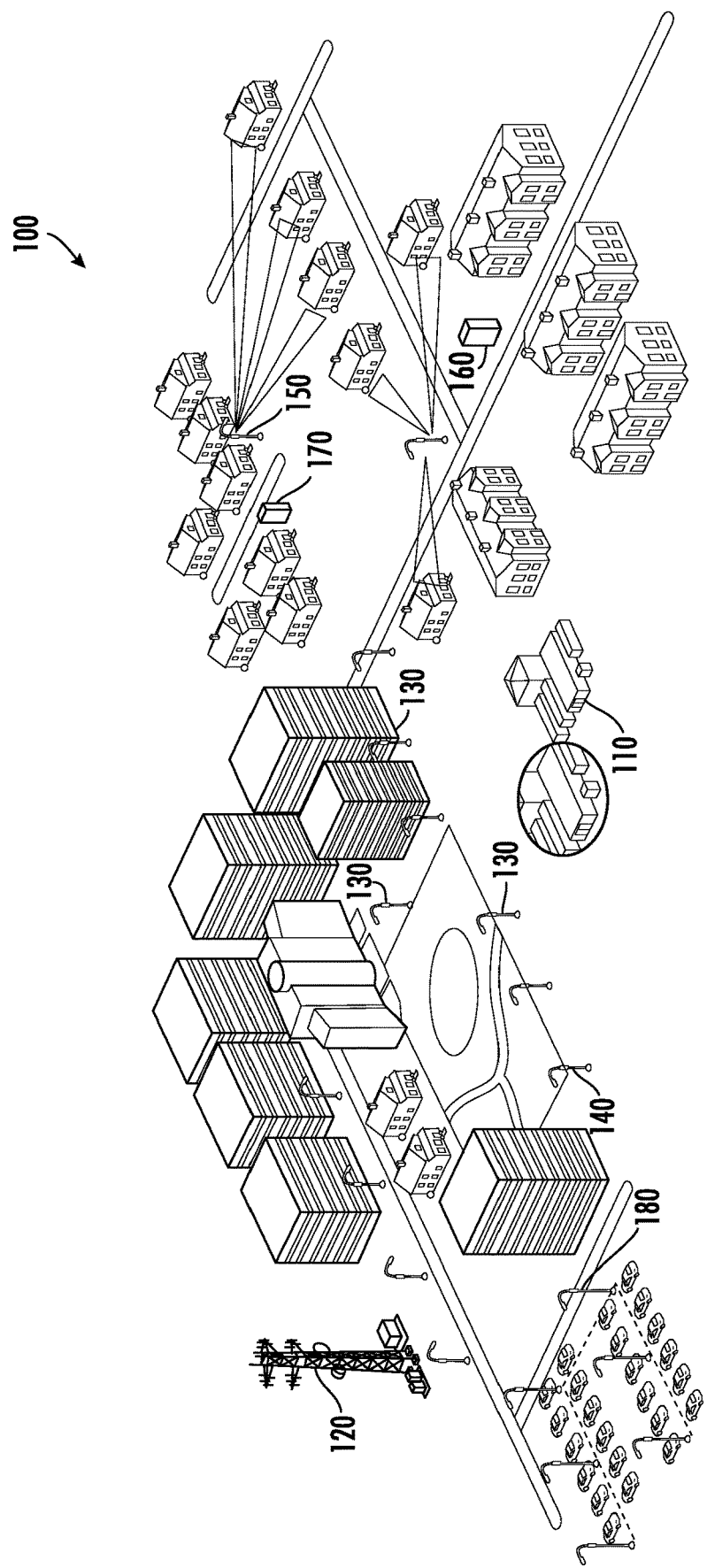
FIG. 1 is a schematic diagram illustrating the increasing power and data connectivity needs for information and communication technology infrastructure in high density access networks.

Pursuant to embodiments of the present inventive concepts, thermal management systems for enclosures for data/power grids are provided. Networks that provide in-line distribution of both power and data to radio nodes and other electronic devices in an outside plant environment are known. The power conductors and optical fibers can be contained in separate cables or in a composite (i.e., combined/hybrid) cable. The purpose of an enclosure for both power conductors and optical fibers is to enable one or more tap offs (e.g., drops) for power connections and also one or more tap offs for fiber data connections for communications devices, such as cellular radios. Such an enclosure may be referred to herein as a "power and fiber enclosure," a "dual enclosure," a "composite enclosure," and/or a "hybrid enclosure." In embodiments in which the enclosure includes a fiber splice area, the enclosure may be referred to herein as a "power and fiber splice enclosure" or a "fiber optic splice closure." In some embodiments, the enclosure may also allow a main feed cable to continue to the next location having a tap off, where another enclosure can be installed. Moreover, the terms "closure" and "enclosure" may be used interchangeably herein.

According to embodiments of the present inventive concepts, an enclosure may comprise a tray for power conductor termination and power tap off. The enclosure may also comprise another tray for fiber optic termination and data tap off. In some embodiments, another tray may provide fiber optic tube slack (e.g., excess tube) storage. The use of different trays can provide demarcation between power and fiber, thus enhancing safety. Additional enhancements may, in some embodiments, include (a) using circuit breakers (e.g., miniature circuit breakers) to allow local power down/protection of equipment, (b) surge protection circuitry, and/or (c) a visual indicator (e.g., a warning light) that power is on. For example, having a circuit breaker at each power tap port can facilitate turning off power at an individual power tap port, thus allowing the technician to perform maintenance with respect to the individual power tap port. As used herein, the terms "power tap port" and "power tap off" may be used interchangeably.

Cellular operators are beginning to deploy 5G cellular networks in an effort to support the increased cellular data traffic with better coverage and reduced latency. One expected change in the cellular architecture that is anticipated with the deployment of 5G networks is a rapid increase in the number of so-called small cell base stations that are deployed. Generally speaking, a "small cell" base station refers to an operator-controlled, low-power radio access node that operates in the licensed spectrum and/or that operates in the unlicensed spectrum. The term "small cell" encompasses microcells, picocells, femtocells, and metrocells that support communications with fixed and mobile subscribers that are within, for example, between about 10 meters and 300-500 meters of the small cell base station, depending on the type of small cell used.

Small cell base stations are typically deployed within the coverage area of a base station of the macrocell network, and the small cell base stations are used to provide increased throughput in high traffic areas within the macrocell. This approach allows the macrocell base station to be used to provide coverage over a wide area, with the small cell base stations supporting much of the capacity requirements in high traffic areas within the macrocell. In heavily-populated urban and suburban areas, it is anticipated that more than ten small cells will be deployed within a typical 5G macrocell to support the increased throughput requirements. As small cell base stations have limited range, they must be located in close proximity to users, which typically requires that the small cell base stations be located outdoors, often on publicly-owned land, such as along streets. Typical outdoor locations for small cell base stations include lamp posts, utility poles, street signs, and the like, which are locations that either do not include an electric power source, or include a power source that is owned and operated by an entity other than the cellular network operator. A typical small cell base station may require between 200-1,000 Watts of power. As small cell base stations are deployed in large numbers, providing electric power to the small cell base station locations represents a significant challenge.

One solution that has been proposed for powering small cell base stations is the use of composite power-data cables. Composite power-data cables allow a cellular network operator to deploy a single cable between a hub and a small cell base station that provides both electric power and backhaul connectivity to the small cell base station. The hub may be, for example, a central office, a macrocell base station, or some other network operator owned site that is connected to the electric power grid. All cellular base stations must have some sort of backhaul connection to the core network, and with small cell base stations the backhaul connection is typically implemented as a fiber optic cabling connection. Because the cellular network operator already would typically deploy a fiber optic cable to a new small cell base station installation, changing the fiber optic cable to a power-plus-fiber cable provides a relatively low cost solution for also providing an electric power connection to the new small cell base station.

Although using composite power-data cables may be an improvement over more conventional solutions for powering small cell base stations and other remote network-connected devices, deploying long composite power-data cables can be expensive and time-consuming, and hence may not be a completely satisfactory solution. As such, new techniques for providing backhaul and power connectivity to 5G small cell base stations and other remote network-connected device may be beneficial.

According to U.S. Patent Application No. 62/700,350, the entire disclosure of which is hereby incorporated by reference herein, power and data connectivity micro grids may be provided for information and communication technology infrastructure, including small cell base stations. These power and data connectivity micro grids may be owned and controlled by cellular network operators, thus allowing the cellular network operators to more quickly and less expensively provide power and data connectivity (backhaul) to new small cell base stations. The power and data connectivity micro grids may be cost-effectively deployed by over-provisioning the power sourcing equipment and cables that are installed, to provide power and data connectivity to new installations, such as new small cell base station installations.

The power and data connectivity micro grids may include a network of composite power-data cables that are used to distribute electric power and data connectivity throughout a defined region. These micro grids may be deployed in high density areas, which is where most 5G small cell base stations will need to be deployed. Each micro grid may include a network of composite power-data cables that extend throughout a geographic area. The network of composite power-data cables (and the sourcing equipment supplying the network of composite power-data cables with power and data capacity) may be designed to have power and data capacity far exceeding the capacity requirements of existing nodes along the micro grid. Because such excess capacity is provided, when new remote network-connected devices are installed in the vicinity of a micro grid, composite power-data cables can be routed from tap points along the micro grid to the location of the new remote network-connected device (e.g., a new small cell base station). The newly installed composite power-data cables may themselves be over-provisioned and additional tap points may be provided along the new composite power-data cabling connections so that each new installation may act to further extend the footprint of the micro grid. In this fashion, cellular network operators may incrementally establish their own power and data connectivity micro grids throughout high density areas, which means that when new small cell base stations, WiFi access points, or other remote powered devices are deployed, they will often be in close proximity to at least one tap point along the micro grid. In many cases, the only additional cabling that will be required to power such new base stations is a relatively short composite power-data cable that connects the new small cell base station to an existing tap point of the micro grid. Moreover, by over-provisioning some or all of the newly-installed composite power-data cables, the micro grids may naturally grow throughout high density areas, thus allowing network operators to quickly and inexpensively add new infrastructure to their networks. The composite power-data cables may be implemented as, for example, power-plus-fiber cables, as such cables have significant power and data transmission capacity. Other composite power-data cables (e.g., coaxial cables), however, may additionally and/or alternatively be used.

The power delivery component of the power and data connectivity micro grids may comprise a low voltage, direct current ("DC") power grid in some embodiments. The DC power signals that are distributed over the micro grid may have a voltage that is higher than the (AC) voltages used in most electric utility power distribution systems (e.g., 110 V or 220 V AC), which may help reduce power loss, but the voltage may be lower than 1500 V DC so as to qualify as a low voltage DC voltage under current standards promulgated by the International Electrotechnical Commission (IEC). For example, the micro grid may carry a 380 V DC power signal (or some other DC voltage greater than 48-60 V and less than 1500 V). The 380 V DC power signal may comprise a +/−190 V DC power signal in some embodiments. Tap points may be installed along the composite power-data cables. The tap points, for example, may comprise intelligent remote distribution nodes that include a gated pass-through power bus that allows for daisy chain operation and/or splitting of the power signal, as well as one or more local ports that may be used to power remote powered devices that are co-located with the intelligent remote distribution node or in close proximity thereto.

The tap points may comprise splice enclosures that are installed along the composite power-data cables. These splice enclosures may include terminations for both the optical fibers and power conductors of the composite power-data cables. The splice enclosures may provide connection points for "branch" composite power-data cables that supply power and data connectivity to existing installations that are connected to the micro grid, may include a gated pass-through power bus, and/or may act as tap points for future installations.

FIG. 1 is a schematic diagram illustrating the increasing power and data connectivity needs for information and communication technology infrastructure in high density access networks. As shown in FIG. 1, in an urban or suburban environment 100, a telecommunications provider, such as a cellular network operator, may operate a central office 110 and a macrocell base station 120. In addition, the telecommunications provider may operate a plurality of small cell base stations 130, WiFi access points 140, fixed wireless nodes 150, active cabinets 160, DSL (e.g., G.fast) distribution points 170, security cameras 180, and the like. All of these installations may require DC power to operate active equipment, and most, if not all, of these installations may also require data connectivity either for backhaul connections to the central office 110 and/or for control or monitoring purposes. It may be both expensive and time consuming to provide local power sources for these installations.

To reduce costs and increase the speed at which electric power and data connectivity can be deployed to remote network-connected powered devices such as the remote devices 130, 140, 150, 160, 170, 180 illustrated in FIG. 1, the use of power-plus-fiber cables has been proposed. For example, PCT Publication No. WO 2018/017544 A1, which is incorporated herein in its entirety by reference, discloses an approach for providing power and data connectivity to a series of remote powered devices in which power-plus-fiber cables extend from a power source to a plurality of intelligent remote distribution nodes. Each intelligent remote distribution node may include a "pass-through" port so that a plurality of remote distribution nodes may be coupled to the power source in "daisy chain" fashion. Intelligent remote powered devices may be connected to each intelligent remote distribution node and may receive power and data connectivity from the intelligent remote distribution node.

One drawback of the approach disclosed in PCT Publication No. WO 2018/017544 A1 is that as new installations are deployed, it is necessary to install another power-plus-fiber cable that runs from the power source to the new installation. Deploying such power-plus-fiber cables can be time consuming and expensive, particularly in urban environments.

According to U.S. Patent Application No. 62/700,350, the power source equipment and remote distribution node approach disclosed in PCT Publication No. WO 2018/017544 A1 may be extended so that cellular network operators may create a hard wired power and data connectivity micro grid throughout high density urban and suburban areas. As new installations (e.g., new small cell base stations 130, security cameras 180, and the like) are deployed in such areas, the cellular network operator may simply tap into a nearby portion of the micro grid to obtain power and data connectivity without any need to run cabling connections all the way from the power and data source equipment to the new installation. The micro grids may be viewed as being akin to the backplane on a computer, as the micro grids extend throughout the area in which power and data connectivity are required and have excess power and data connectivity resources available so that new installations may simply "plug into" the micro grid at any of a large number of tap points.

Figure 2:
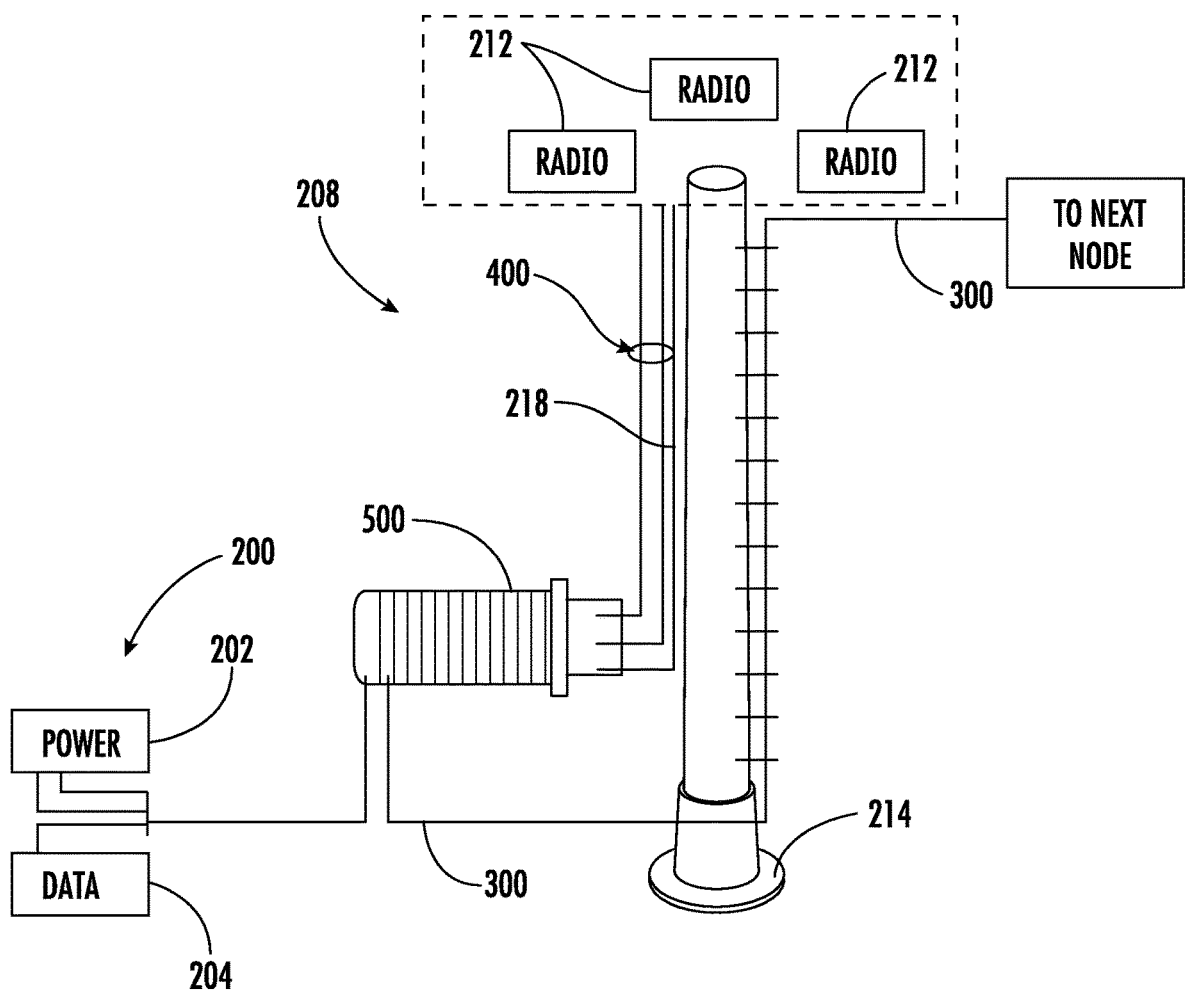
FIG. 2 is a schematic diagram illustrating an embodiment of a node on a network such as shown in FIG. 1.

Referring to FIG. 2, a schematic view of an embodiment of a portion of a network architecture is shown. A plant 200 provides distributed power from a power source 202 and data from a data source 204 to the network. The power and data may be delivered using hybrid power-data cables 300 to nodes 208 on the network. In the illustrated embodiment the node 208 is a small cell base station comprising radios 212 mounted on a support structure 214 such as a tower. In some embodiments, the enclosure 500 defines a tap point that may be provided along the composite power-data cable 300 that allow for daisy chain operation and/or splitting of the power and data signals. As shown in FIG. 2, enclosure 500 separately delivers the power and data to the equipment at the node. The data may be delivered over a separate data line 218 such as a fiber optic cable. The power may be delivered using a power cable 400. Separating the power and data at the node may be necessitated by the service provider's equipment architecture. Separating the power and data at the node also may facilitate maintenance and repair.

Figure 3:
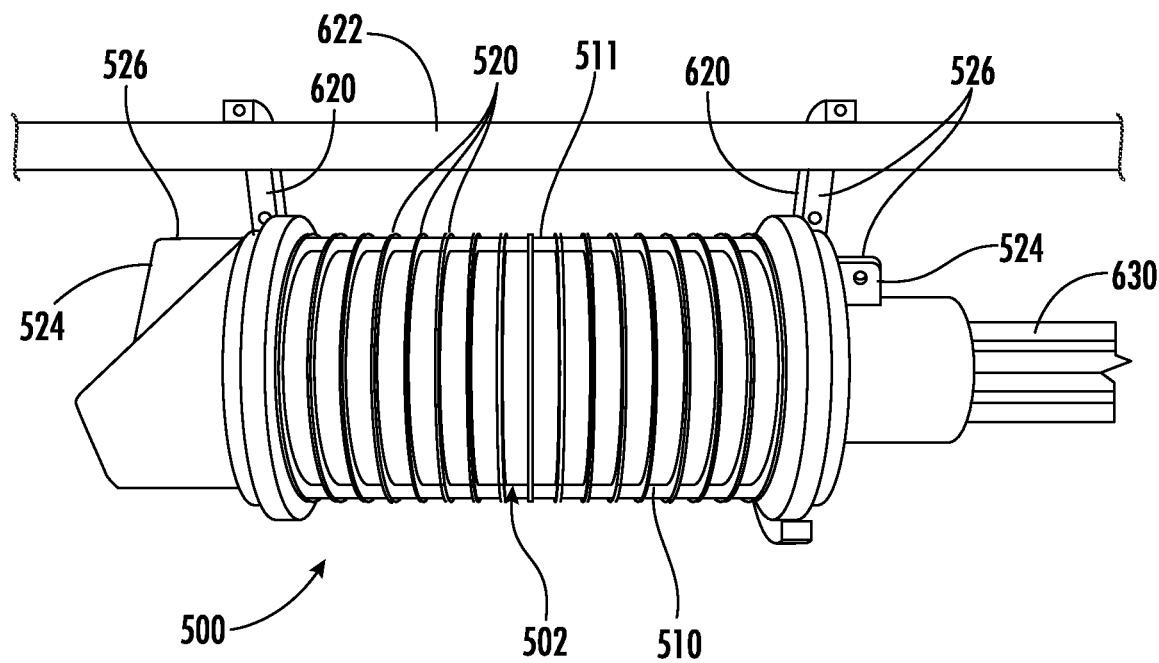
FIG. 3 is a side view of an enclosure used at a network node such as shown in FIG. 2.

An embodiment of an enclosure 500 is shown in FIG. 3. In the illustrated embodiment the enclosure 500 includes a fiber splice area and may be referred to as a fiber optic splice closure or "FOSC." An embodiment of one such enclosure is described in application WO 2020/040913, entitled "Hybrid Enclosures for Power and Optical Fiber and Enclosures Including Multiple Protective Lids" filed Jul. 19, 2019 by CommScope Technologies LLC to Thomas et al. which is incorporated by reference herein in its entirety. The enclosure 500, which may also be referred to herein as a "closure," may include a polymer (e.g., plastic) housing 502 defined by a base portion 510 and a polymer dome 511, or other structure, that can releasably attach to the base portion 510 to enclose the internal structure of the enclosure. The enclosure 500 may thus protect the elements within the enclosure 500 from weather, wildlife, and other elements that should not contact the trays internal components. The internal structure of the enclosure 500 may be accessed by removing the dome 511 from the base portion 510.

Figure 4:
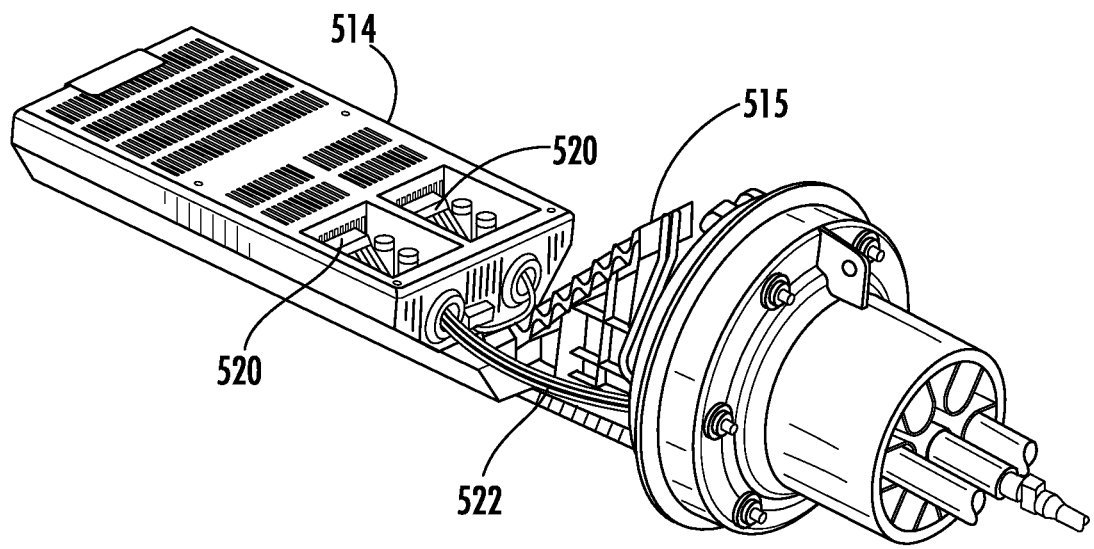
FIG. 4 is a perspective view of a portion of the internal components of the enclosure of FIG. 3.
Figure 5:
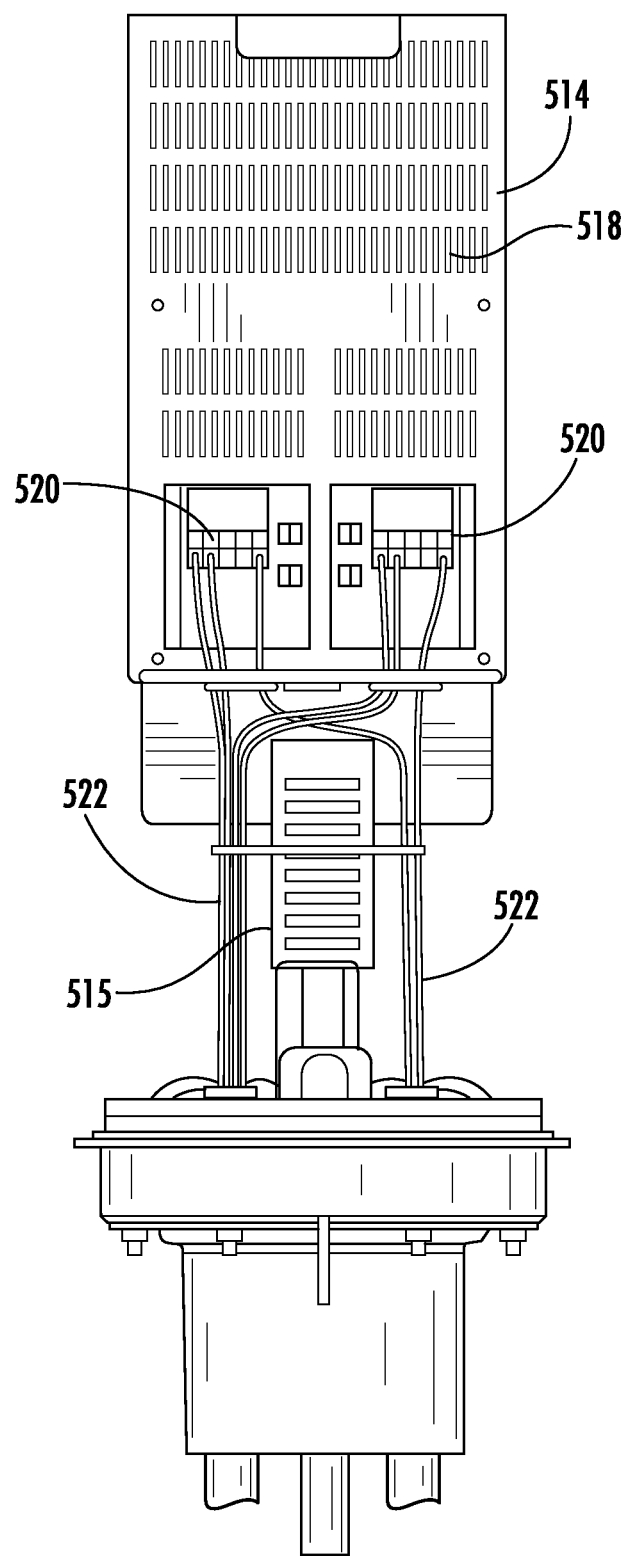
FIG. 5 is a top view of the internal components of the enclosure of FIG. 4.
Figure 10:
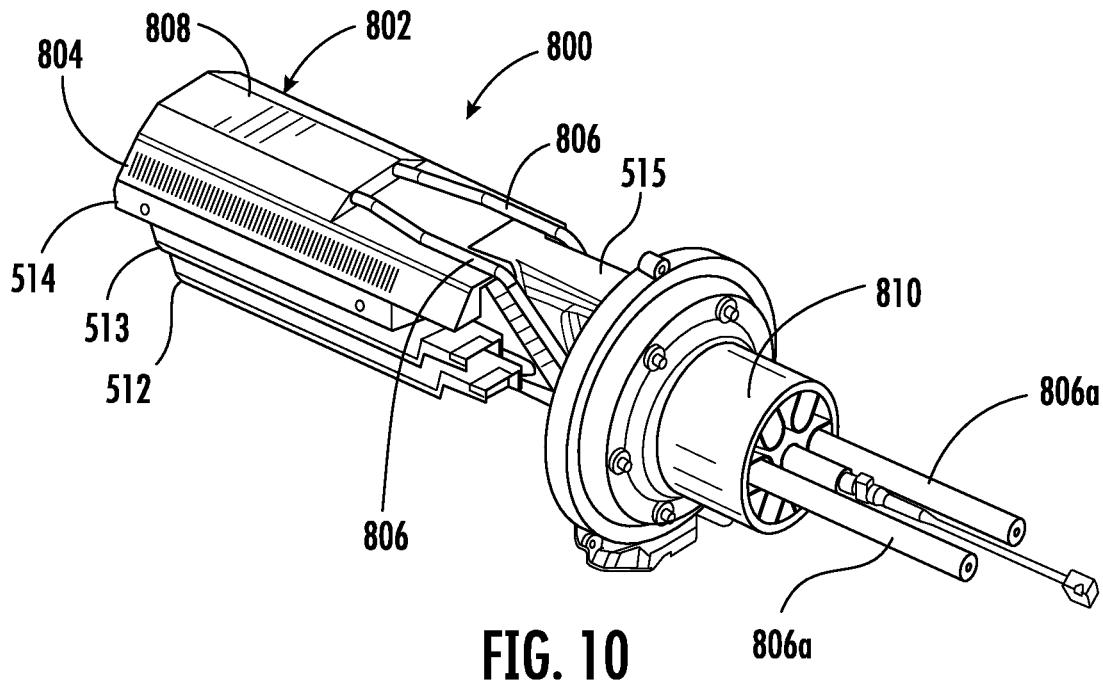
FIG. 10 is a perspective view of the internal components of the enclosure showing a thermal management system according to embodiments of the present inventive concepts.

FIGS. 4, 5 and 10 show an embodiment of the internal structure of an enclosure 500 such as shown in FIG. 3. In one embodiment, a plurality of trays 512, 513 and 514 may be attached to an attachment structure 515. In some embodiments, the trays 512 and 513 may be hingedly coupled to respective portions of the attachment structure 515 so that a technician can more easily access one of the trays while the trays are attached to the attachment structure 515. For example, such hinged/tiltable coupling to the attachment structure 515 may allow the technician to access a particular one of the trays 512-514 in a manner that reduces disturbance to others of the trays. In use, the trays 512-514 can be stacked on top of one another while the trays are attached to the attachment structure 515 as shown in FIG. 10.

The trays 512 and 513 may be trays for fiber connection and/or storage. The trays 512, 513 may hold one or more fiber optic tubes. The tray 514 may be a tray for power connectivity and may hold one or more power cables. A greater or fewer number of trays may be provided in various combinations of fiber connection/storage trays and power connection/storage trays. In addition to protection provided by the enclosure 500, one or more of the trays 512-514 may be further protected by tray lids.

One or more optical fiber splice areas/terminals may be in (e.g., attached to) the trays 512 and/or 513. Optical fibers (e.g., from one or more fiber optic tubes in composite cable 300) may be connected to the optical fiber splice areas/terminals, which thus may be referred to herein as "optical fiber tap offs." For example, the tray 512 may comprise one or more optical fiber splice modules, each of which includes an area in which a plurality of optical fiber connections can be made. The tray 513 may comprise an optical fiber storage tray/area. For example, the tray 513 may have storage capacity for at least one meter, or at least two meters, of length of one or more fiber optic tubes.

The tray 514 may house one or more power ports 520 to which power cables 522 are electrically connected. The power ports 520 may comprise a power-in port and a power-out port, respectively, and some of the power ports may be power tap ports. As an example, a voltage at each power-in/out port may be 380 V DC (e.g., +/−190 V DC on the two power conductors), and the power tap ports may feed adjacent utility poles and/or other remote nodes. The power ports 520 may comprise connector blocks; however, each power port may comprise any type of electrical port and is not limited to a connector block. Accordingly, the power ports may be connectorized or non-connectorized ports. Additionally or alternatively, the tray 514 may house circuit breakers that comprise, or are electrically coupled to, the power ports 520. For example, the circuit breakers can be used in the place of connector blocks. The circuit breakers can facilitate individually turning off power at one or more of the power ports instead of turning off power to the entire group.

The power ports 520 may be on power circuitry 518. For example, the power circuitry 518 (FIG. 5) may be a printed circuit board, or other wiring, that provides electrical connections for the power ports. As an example, the power circuitry 518 may electrically connect ground components of the cables from the power ports to a common ground connection. Additionally or alternatively, the power circuitry 518 may be configured to supply data, and/or power that exceeds 150 Watts, to and/or from the power ports. Although some devices, such as security cameras 180 (FIG. 1) or WiFi access points 140 (FIG. 1), can operate with power that is lower than 150 Watts, most devices that are coupled to the power ports 240 are configured to use power that exceeds 150 Watts. One example is small cell base stations 130 (FIG. 1), which may use power between about 200 and about 1,000 Watts.

Moreover, although the above-description describes an example enclosure in which, for safety purposes, the power ports 520 are separate from the optical fiber tap offs in tray 513, in some embodiments in which the ports are connectorized, the ports 520 may be combination ports that include both a power conductor terminal and an optical fiber tap off in the same connector block.

The enclosures 500 may be installed at locations where intelligent remote distribution nodes ("IRN") or other remote distribution nodes are deployed. The enclosures 500 may be installed, for example, underground or above ground. One pair of a power output port and a data output port may be viewed as a "pass-through" ports that allow the enclosures to be daisy-chained together. The remaining pairs of power and data output ports may be viewed as "tap" ports that may be used to provide power and data connectivity to individual remote network-connected devices (or co-located groups thereof). When a new remote powered device, such as a small cell base station, is to be deployed, an intelligent remote distribution node may be installed at the site for the new small cell base station (e.g., on a utility pole where the small cell radio and antenna are mounted). A power-plus-fiber cable may then be deployed between the newly-installed intelligent remote distribution node and the closest enclosure 500 of the power and data connectivity micro grid, and a short jumper cable (or cables) may connect the intelligent remote distribution node to the small cell radio. The enclosure 500 may be designed to output DC power signals (e.g., 380 V DC) to each output port thereof (i.e., the pass-through port and the tap ports). The intelligent remote distribution node may include step-down equipment, such as a buck converter, that reduces the voltage level of the DC power signals delivered thereto from the enclosure 500 to a level that is suitable for powering the remote powered device. The intelligent remote distribution nodes may or may not include pass-through power buses that allow daisy-chaining multiple intelligent remote distribution nodes together. Moreover, in some embodiments some or all of the functionality contained in the intelligent remote distribution nodes may be moved to the enclosure 500 such that the enclosure 500 may include the electronics, such as the buck converter, that reduces the voltage level of the DC power signals delivered from the enclosure 500 to a level that is suitable for powering the remote powered device.

To supply data connectivity to a newly-installed node 208, such as a small cell base station, one or more of the optical fibers of power-plus-fiber cable 300 may be spliced in the enclosure 500 to connect to a data tap port of the enclosure 500. The data tap port of the enclosure 500 may be connected to a data input port on the node 208 via, for example, a fiber cable 218 or by a composite power-data cable. The power tap port of the enclosure 500 may be connected to a power input port on the node 208 via, for example, a power cable 400 or by a composite power-data cable. In this fashion, the enclosure 500 may provide power and data connectivity to the node 208 such as a small cell base station.

The splice enclosure 500 may provide a plurality of tap points along each power-plus-fiber cable, thereby providing numerous locations where the cellular network operator may tap into the micro grid to provide power and data connectivity for future installations. The enclosures 500 may be pre-installed along the power-plus-fiber cables, or slack loops may be included in the power-plus-fiber cables and the splice enclosures 500 may be installed later as needed.

An enclosure, such as enclosure 500 such as described above, includes active electronic elements that generate heat. Moreover, such enclosures are typically located outside and above-ground such that the enclosures 500 can be easily accessed by technicians. One issue with outside located enclosures is that heat generated by the sun's radiation also increases the temperature inside of the enclosure 500. As a result, thermal management of enclosures such as the enclosure 500 described herein is required.

Figure 6:
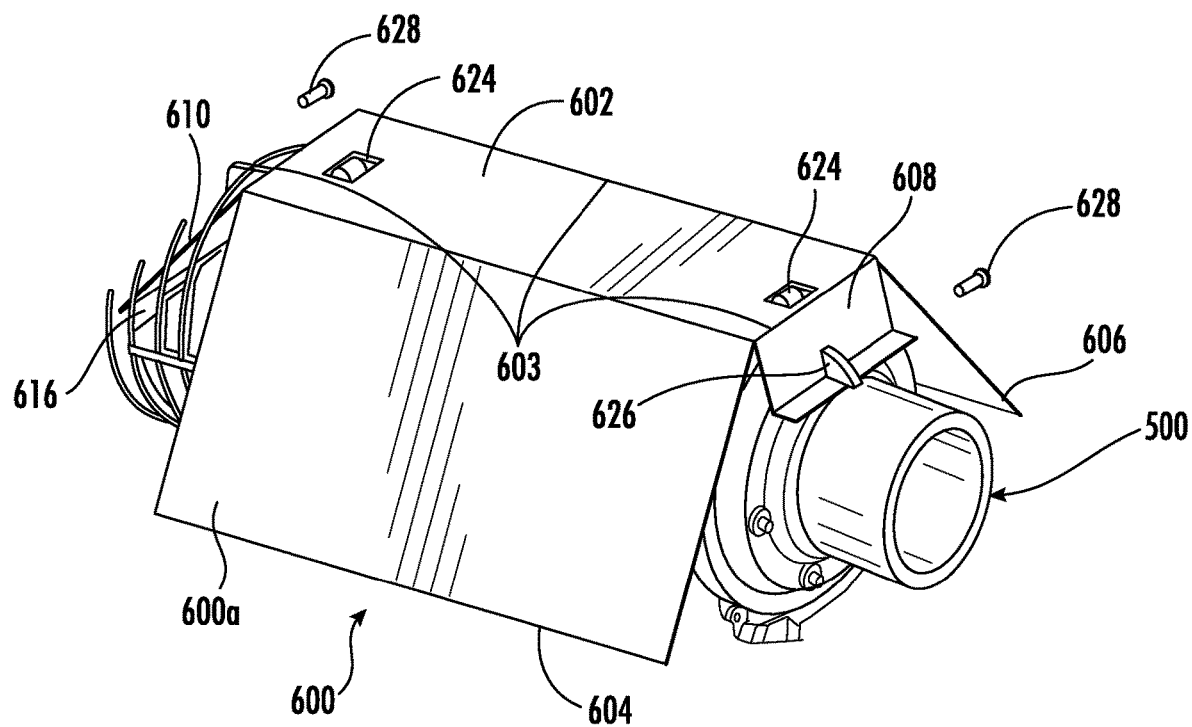
FIG. 6 is a perspective view of an enclosure with a solar shield according to embodiments of the present inventive concepts.

Referring to FIG. 6, in a first embodiment, a solar shield 600 may be deployed over the enclosure 500 that prevents solar radiation from reaching the enclosure 500. The solar shield 600 may be any suitable radiant barrier that reflects thermal radiation and reduces heat transfer to the enclosure 500. The solar shield 600 may be made of aluminum or other reflective metal. The solar shield 600 may also be made of a rigid reflective plastic such as white thermoplastic. The solar shield 600 may also be made of a composite material such as a plastic base layer covered by a reflective material such as a metal film. The solar shield 600 may also be made of a reflective fabric, reflective film or other flexible material supported by a rigid frame. In some embodiments, the exterior surface 600a of the solar shield 600 may be made diffusive such that the light reflected by the solar shield is reflected in a diffuse manner such that glare spots are not created. The exterior surface 600a of the solar shield 600 may be made diffusive by applying a diffusive material to the exterior surface 600a, by using a material having diffusive properties such as white plastic, by providing the surface 600a with a diffusive finish such as by etching, or the like.

Figure 14:
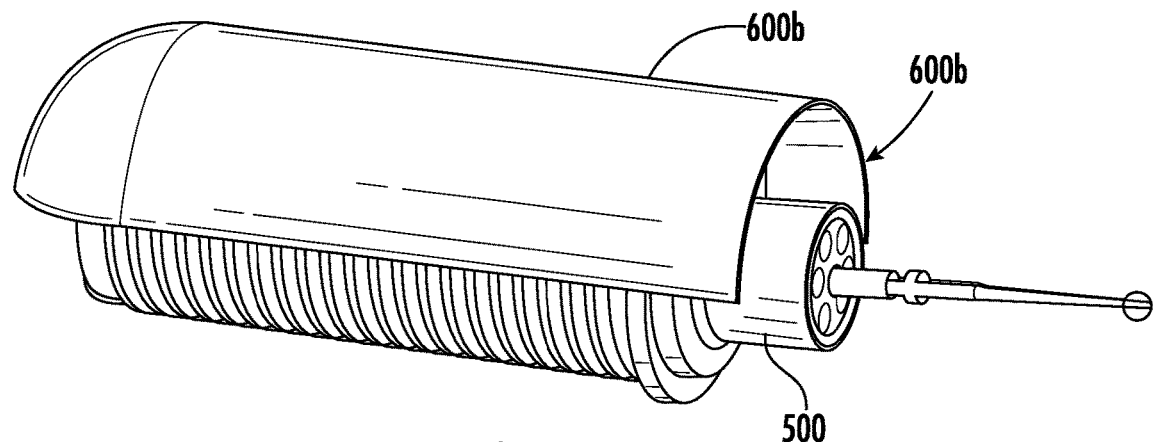
FIG. 14 is a perspective view showing another alternate embodiment of the solar shield.
Figure 15:
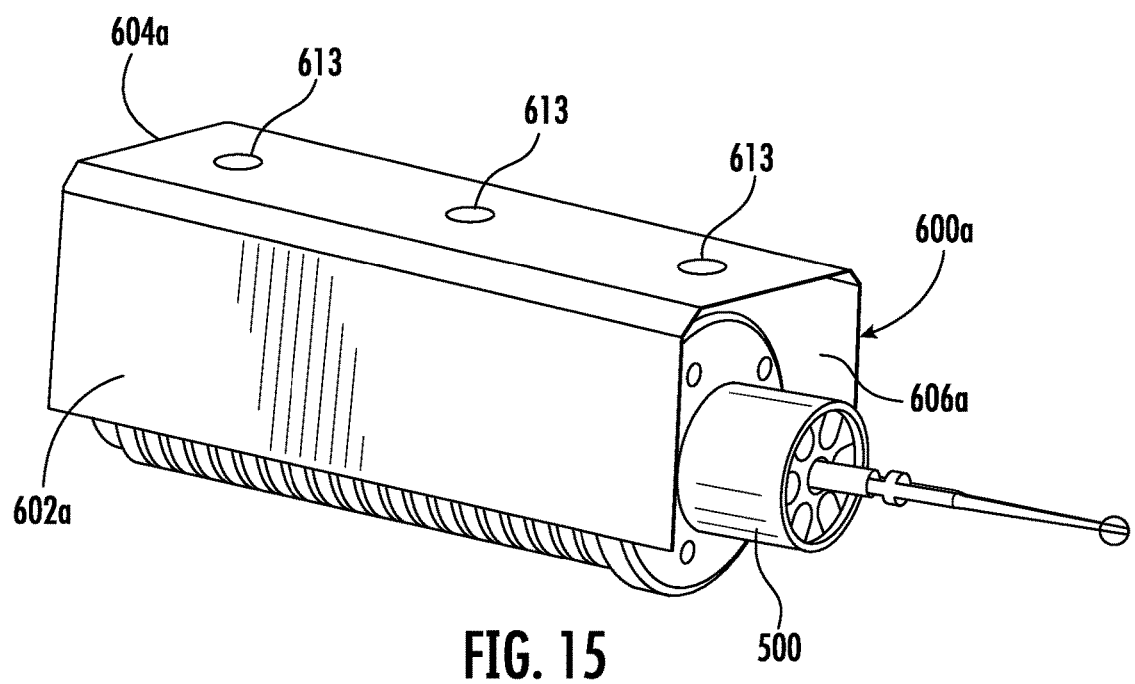
FIG. 15 is a perspective view showing yet another alternate embodiment of the solar shield.

The solar shield 600 may have a tent-like configuration that partially encircles the enclosure 500 and that covers the top and side portions of the enclosure 500 but that leaves the bottom portion of the enclosure 500 uncovered as shown in FIG. 6. Because the solar shield 600 is used to prevent heating of the enclosure 500 caused by the sun's radiation, the solar shield 600 need only be located over areas of the enclosure 500 that would be exposed to the sun's radiation when the enclosure 500 is deployed in the field. The solar shield 600 may be formed of a plurality of panels 602, 604, 606, 608 and 610 that are connected together at joints 603 to form the complete solar shield 600. The solar shield 600 as shown in FIG. 6 comprises a top panel 602 with two side panels 604, 606 and two end panels 608, 610 extending from the top panel 602 at joints 603 at a downward angle therefrom. The solar shield 600 may include a fewer or greater number of panels that define any open polygonal shape. For example, the solar shield 600 may have a substantially inverted V-shape or other open polygon shape. The solar shield 600 may formed as an integral, one-piece member such as a sheet of aluminum bent at joints 603 to create the solar shield 600 such as in a metal forming process such as extrusion, stamping, rolling or the like, or by being molded in one-piece of plastic or polymer in an injection molding, extrusion or similar process. Alternatively, the panels may be separate panels joined together to create the solar shield 600. Moreover, while the illustrated solar shield 600 has a rectilinear shape formed by flat panels 602, 604, 606, 608 and 610, the panels may be curved in one or more planes. Another example embodiment of the solar shield 600a is shown in FIG. 15. The solar shield 600a is formed by three flat panels 602a, 604a and 606a arranged in an inverted open box structure. The solar shield may also have a continuous surface uninterrupted by joints such as a continuously curved surface. For example, the solar shield 600b may have a substantially inverted U-shape, as shown in FIG. 14, that is a continuous curve. In other embodiments, the solar shield 600 may completely encircle the enclosure 500 where the solar shield 600 is shaped in cross-section as a circular, oval, octagon, hexagon, other polygon shapes, or the like.

In some embodiments, the solar shield 600 completely covers the surfaces of the enclosure 500 that would otherwise receive the sun's radiation. However, small portions of the enclosure 500 may be left uncovered and still obtain the benefits of using the heat shield. In this manner, the solar shield 600 covers a major portion of the enclosure 500 where the major portion of the enclosure 500 covered by the solar shield 600 is sufficient to prevent overheating of the enclosure 500 caused by the sun's radiation. A hole or a plurality of holes 613 may be formed in the top of the solar shield 600 (FIG. 15) to create a chimney affect that pulls the cool air between the enclosure 500 and the solar shield 600 to aid in the dissipation of heat which is created primarily from the solar shield 600 due to the exposure to the sun, but is also created by heat that is generated within the enclosure 500 and dissipated through the walls of the enclosure 500.

In some embodiments, the solar shield 600, when mounted over the enclosure 500, is spaced from the enclosure 500 such that an air gap 616 is created between the solar shield 600 and the enclosure 500. Providing the air gap 616 prevents the conduction of heat directly from the solar shield 600 to the enclosure 500. In some embodiments, the solar shield 600 may be formed to create the air gap 616. For example, as shown in FIG. 6 the front end panel 608 and the back end panel 610 may be shaped to engage the enclosure 500 in a manner that spaces the majority of the solar shield 600 from the enclosure 500. Spacers may also be provided on the underside of the solar shield 600 to create the air gap 616. The spacers may comprise separate members connected to one of the solar shield 600 and the enclosure 500 or the spacers may be formed as one-piece with the solar shield 600. For example, a solar shield 600 made of molded plastic may have spacers formed as one piece therewith during the molding process. Likewise, a solar shield 600 made of a sheet of metal may have the spacers punched and bent out of the metal sheet as part of the metal forming process. Moreover, a suitable air gap may be created by the shape of the enclosure 500 itself. For example, as shown in FIG. 3, the enclosure 500 may be formed with a fins 520 where the solar shield 600 may sit on the fins 520 if the heat transferred to the enclosure 500 due to contact with the solar shield 600 is acceptably low.

FIG. 3 shows a common mounting structure for an enclosure 500 where the enclosure 500 is mounted on a support 622 such as a pole, cable or wire by connectors 620 such as straps, flanges that may be made of any suitable material such as metal, plastic or combinations of such materials. The solar shield 600 may be provided with openings 624 (FIG. 6) on a top portion thereof such that the connectors 620 can extend through the openings 624 to trap the solar shield 600 between the support 622 and the enclosure 500. The solar shield 600 may further include openings 626 for receiving flanges 524 formed on the enclosure 500. In some embodiments, existing enclosures 500 are provided with such flanges 524 as part of their mounting structure. The solar shield 600 may be designed with mating apertures 626 to receive the existing flange structures 524 on the enclosures 500. The location, size, shape, etc. of the flanges 524 may differ from those shown in FIG. 3 and the mating apertures 626 may be designed to mate with the flanges 524. Fasteners 628, such as bolts, straps, zip ties, cotter pins or the like, may be used to engage apertures 526 formed on the flanges 524 and fix the solar shield 600 to the enclosure 500. In other embodiments, the solar shield 600 may be secured to the enclosure 500 by separate fasteners such as metal straps or zip ties that encircle the solar shield 600 and the enclosure 500.

Because the enclosure 500 is in a fixed position relative to the support 622, the solar shield 600 may be connected to the support 622 and/or the connectors 620 rather than directly to the enclosure 500. Alternatively, the solar shield 600 may be connected to both of the enclosure 500 and the support 622. The solar shield 600 may be connected to the support 622 and/or the connectors 620 using various connection devices. For example, if the support 622 is a pole the connection mechanism may comprise a pole clamp, if the support 622 is a cable or wire the connection mechanism may comprise a cable clamp, and where the support 622 is a building or other structure the solar shield 600 may be connected to the building by screws or the like. The solar shield 600 may also be connected to connectors 620 using clamps, bolts, screws or the like.

In some embodiments, the enclosure 500 may be mounted other than horizontally where the long axis of the enclosure 500 extends other than horizontally. In such an embodiment, the solar shield 600 may be disposed at least partially over the exposed end of the enclosure 500. The solar shield 600 may include an aperture or apertures to allow the cables 630 to pass through the solar shield 600. In any orientation of the enclosure 500, the solar shield 600 is disposed between the enclosure 500 and direct light from the sun to reflect radiated solar energy before it reaches the enclosure 500.

Figure 7:
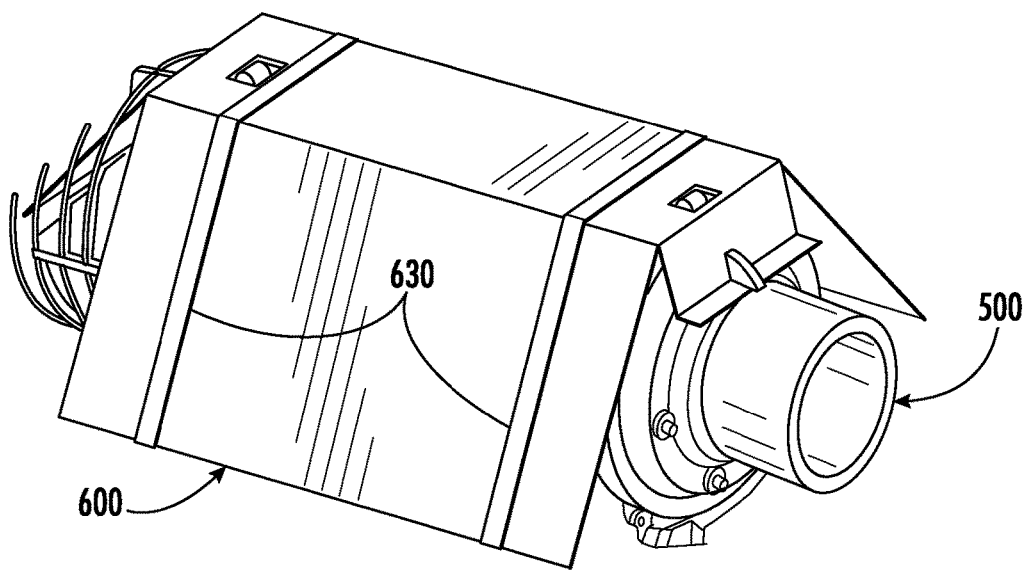
FIG. 7 is a perspective view of an enclosure with another embodiment of the solar shield according to embodiments of the present inventive concepts.

Referring to FIG. 7, in one embodiment, the solar shield 600 may include indicators 630 such as color-coded stripes that indicate if the enclosure 500 contains electrical power to alert technicians, emergency personnel or others of the status of the enclosure 500. The indicators 630 may be formed by tape, cable wrap, colored zip ties, paint or the like.

Figure 8:
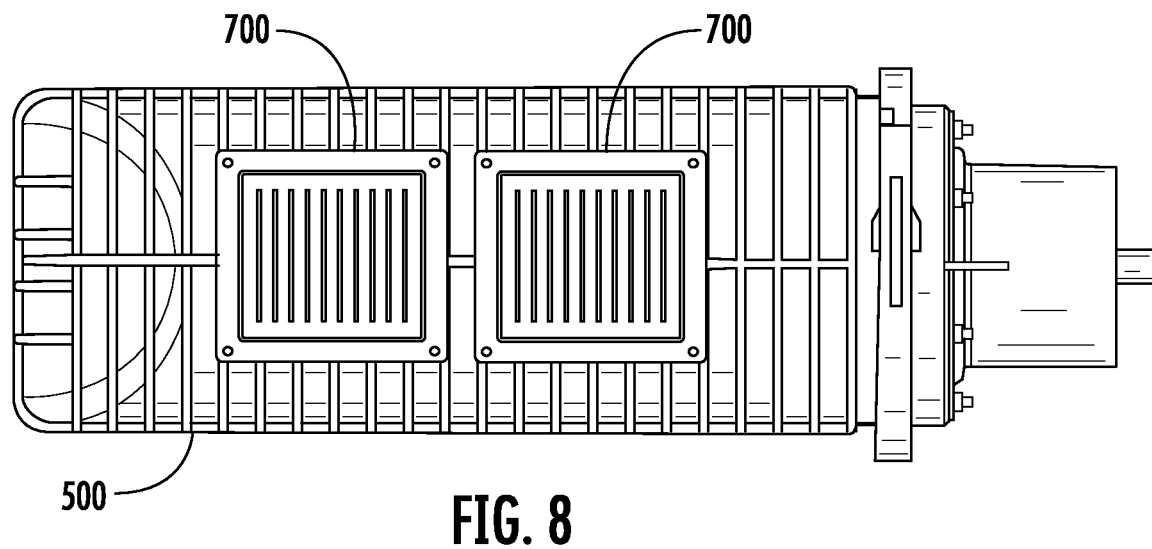
FIG. 8 is a top view of a vented enclosure according to embodiments of the present inventive concepts.
Figure 9A:
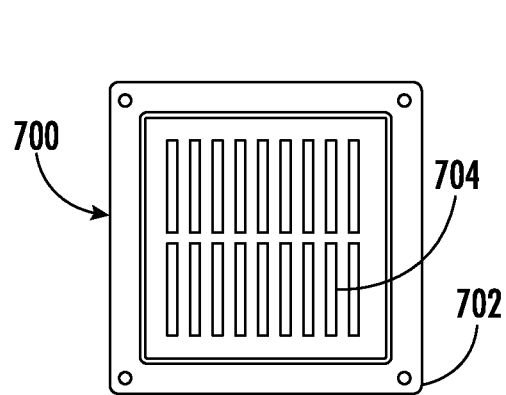
FIGS. 9A and 9B are top views of embodiments of vents usable in the enclosure of FIG. 8.
Figure 9B:
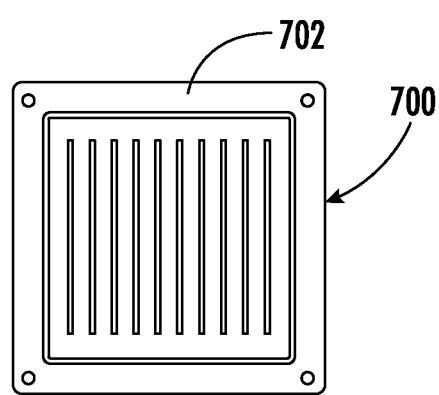

Referring to FIGS. 8, 9A and 9B, in another embodiment, vents 700 may be provided in the housing 502 of the enclosure 500 to vent hot air from the enclosure 500. The vents 700 may be used with or without the solar shield 600 described above depending on the heat management requirements of the system. In one embodiment, the vents 700 are placed on the side of the housing 502 that faces upward when the enclosure 500 is installed such that the system takes advantage of the rising heat in the enclosure to vent the hot air via vents 700. While two separate vents 700 are shown in FIG. 8, a greater or fewer number of vents 700 may be used and the size and shape of the vents may vary from the vents 700 as shown in FIGS. 8, 9A and 9B. In some embodiments, the vents 700 may comprise a polycarbonate frame 702 covered by a waterproof membrane 704 such that water is prevented from entering the enclosure through the vents 700 but air is allowed to flow out of the vents 700. The membrane 704 may be a water tight ePTFE membrane. The vents 700 also balance the air pressure within the enclosure 500. The use of the solar shield 600 with the vents 700 provides further protection against rain entering the enclosure 500 via the vents 700.

Figure 11:
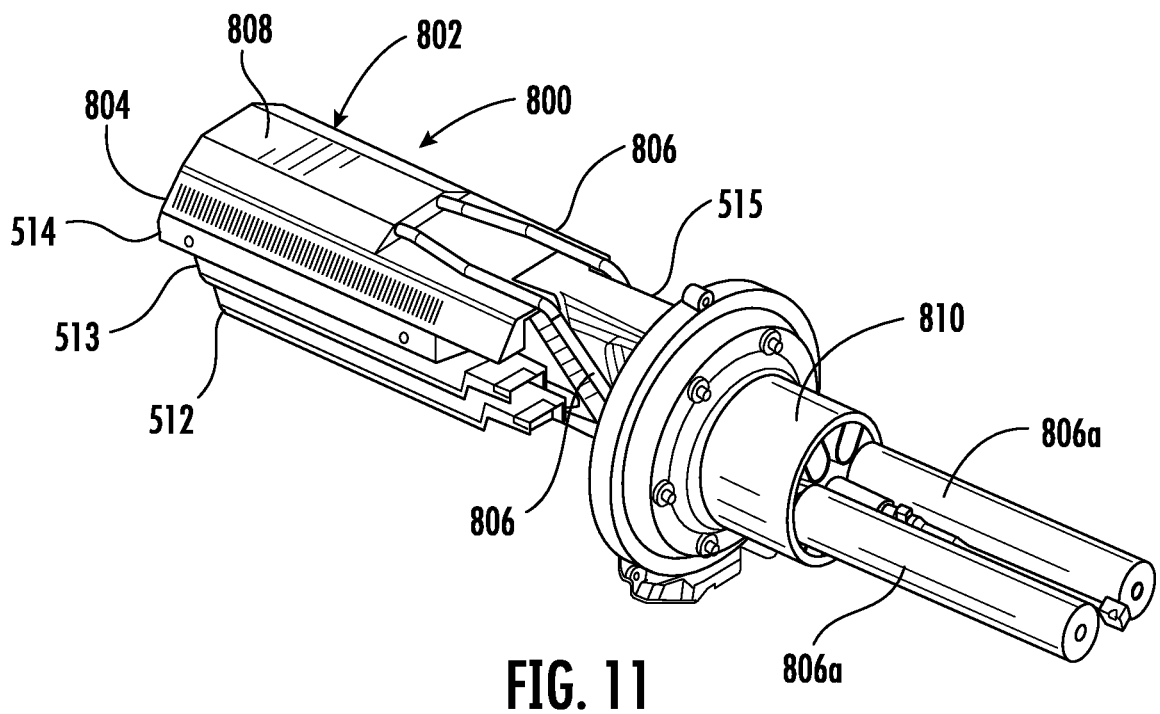
FIG. 11 is a perspective view of the internal components of the enclosure showing a thermal management system according to other embodiments of the present inventive concepts.

Reference is made to FIGS. 10 through 13 which show an embodiment of a cooling condenser thermal management system 800 for use in an enclosure 500. The cooling condenser thermal management system 800 may be used with or without either or both of the vents 700 and solar shield 600 as described above. FIGS. 10 and 11 show the internal structure of the enclosure 500 with the outer housing 502 removed. Moreover, the structure as shown in FIGS. 10 through 13 is shown in an inverted or upside-down orientation to better illustrate the cooling condenser thermal management system 800. In actual use, the structure is typically rotated 180 degrees such that the thermal management system 800 is disposed toward the bottom of the enclosure 500. The cooling condenser thermal management system 800 comprises a heat sink structure 802 that is thermally coupled to the internal structure of the enclosure 500. In the illustrated embodiment, the heat sink structure 802 is mounted to the outside surface of a metal, or otherwise thermally conductive, plate 804 that is thermally coupled to the power tray 514. The power components in the power tray 514 are thermally coupled to the plate 804 such that the heat sink structure 802 is thermally coupled to the heat generating internal power components. The heat sink structure 802 may comprise a substantially solid heat sink block 808 made of a thermally conductive material such as aluminum, copper or other metal, thermally conductive plastic or the like. The heat sink structure 802 may be thermally coupled to any heat conducting or heat producing component of the enclosure 500.

At least one, and in the illustrated embodiment two, condenser pipes 806 are engaged with the heat sink block 808. While two condenser pipes 806 are shown a greater or fewer number of condenser pipes 806 may be used. Moreover, while the two condenser pipes 806 are connected to a single heat sink block 808, a separate heat sink block 808 may be provided for each condenser pipe 806. The heat sink block 808 includes at least one internal conduit (not visible in FIGS. 11 and 13) that is fluidly coupled to the condenser pipes 806 such that fluid can flow between the internal conduits of heat sink block 808 and the condenser pipes 808. In some embodiments, a single internal conduit may be connected to both condenser pipes 806 or each condenser pipe 806 may connect to a separate internal conduit. The internal conduit(s) may be formed as bores formed in the heat sink block 808 and the condenser pipes 806 may connect to the bores at the exterior of the heat sink block 808. Alternatively, the condenser pipes 806 may extend into the bores and be thermally coupled to the heat sink block 808.

Figure 12:
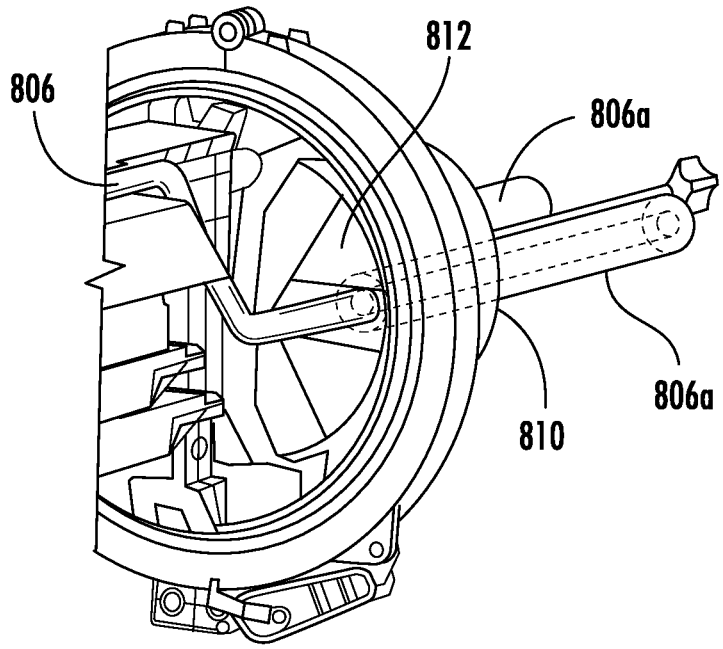
FIGS. 12 and 13 are detailed perspective views of thermal management system of FIG. 11.
Figure 13:
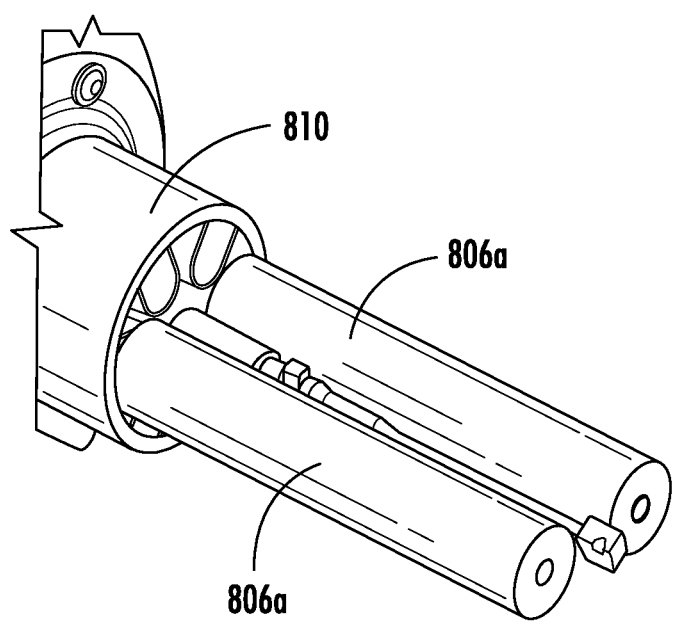

The condenser pipes 806 extend to the exterior of the enclosure 500 such that a portion 806a of each of the condenser pipes 806 is exposed to the ambient environment. The condenser pipes 806 may extend through apertures in the cap 810 and seals or gaskets 812, such as gel pack seals, may be used to seal the apertures. A working fluid is contained in the condenser pipes 806. The working fluid may be any suitable fluid such as water, alcohol, refrigerants, or the like, and/or any fluid that is commonly used in heat pipes, pumped refrigerant and thermosyphon systems]. In operation, the liquid working fluid in the condenser pipes is heated by the heat conducted to the heat sink block 808 and is evaporated to form a gas. The condenser pipes 806 are configured such that the gas travels through the condenser pipes 806 to the exterior of the enclosure 500, the gas is cooled by heat transfer to the surrounding ambient air and condenses back to the liquid state, the liquid working fluid in the exposed portions 806a of the condenser pipes 806 flows back to the heat sink block 808, and the process is continuously repeated. As shown in FIGS. 11-13, the condenser pipes 806 may have any suitable dimensions and the exposed, external portions 806a of the condenser pipes 806 may have different dimensions than the internal portion of the condenser pipes 806. For example, the external portions 806a of the condenser pipes of FIG. 11 is thicker than the external portions 806a of the condenser pipes 806 of FIG. 10 to facilitate heat transfer to the ambient environment. The external portions 806a shown in FIG. 11 may be provided by using a separate section of pipe or by adding the larger section of pipe over the narrower pipe section provided that the separate pipe components are thermally coupled to one another.

The use of thermal management system 800 provides localized cooling for any component that is thermally coupled to the heat sink structure 802. Moreover, the thermal management system 800 provides cooling of the air in the enclosure.

The present inventive concepts have been described above with reference to the accompanying drawings. The present inventive concepts are not limited to the illustrated embodiments. Rather, these embodiments are intended to fully and completely disclose the present inventive concepts to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the example term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," and the like can mean either direct or indirect attachment or contact between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, operations, elements, and/or components, but do not preclude the presence or addition of one or more other features, operations, elements, components, and/or groups thereof.

That which is claimed is:

1. A power and fiber splice enclosure comprising:
   a housing including electrical components and a power-plus-fiber-cable; and
   a solar shield external to the housing and on at least a major portion of the housing,
   wherein the solar shield at least partially encircles three sides of the housing but is open on a fourth side of the housing,
   wherein a portion of the housing protrudes from an encircled portion of the solar shield, and
   wherein the solar shield comprises a plurality of panels that includes a top panel and two side panels that are angled greater than 90 degrees with respect to the top panel.

2. The power and fiber splice enclosure of claim 1, wherein the solar shield comprises at least one of a radiant barrier that reflects thermal radiation, a reflective metal, aluminum, reflective white plastic, a base layer covered by a reflective material, or a reflective flexible material mounted on a rigid frame.

3. The power and fiber splice enclosure of claim 1, wherein a reflective exterior surface of the solar shield is diffusive.

4. The power and fiber splice enclosure of claim 1, wherein the solar shield comprises a plurality of panels.

5. The power and fiber splice enclosure of claim 4, wherein the plurality of panels are formed as an integral, one-piece member.

6. The power and fiber splice enclosure of claim 4, wherein at least one of the plurality of panels is curved.

7. The power and fiber splice enclosure of claim 1, wherein the solar shield has a rectilinear shape formed by a plurality of flat panels.

8. The power and fiber splice enclosure of claim 1, wherein a shape of the solar shield is in cross-section one of a circle, oval, octagon, hexagon, polygon, open polygon, substantially U-shape, or substantially V-shape.

9. The power and fiber splice enclosure of claim 1, wherein the solar shield is spaced from the enclosure such that an air gap is created between the solar shield and the housing.

10. The power and fiber splice enclosure of claim 1, wherein the solar shield is mounted directly to the enclosure, or the solar shield is mounted to a support for the enclosure.

11. The power and fiber splice enclosure of claim 1, wherein a vent is in the housing.

12. The power and fiber splice enclosure of claim 11, wherein the vent is on a side of the housing that faces upward when the enclosure is installed.

13. The power and fiber splice enclosure of claim 11,
    wherein the vent comprises a frame covered by a waterproof membrane, and
    wherein the waterproof membrane comprises a water tight ePTFE membrane.

14. The power and fiber splice enclosure of claim 1, further comprising:
    a condenser thermally coupled to a heat conducting component for cooling at least the heat conducting component.

15. The power and fiber splice enclosure of claim 14,
    wherein the condenser comprises a heat sink block thermally coupled to the heat conducting component,
    wherein a condenser pipe is in fluid communication with the heat sink block, and
    wherein the heat sink block comprises an internal conduit that is in fluid communication with the condenser pipe.

16. The power and fiber splice enclosure of claim 15, wherein a portion of the condenser pipe extends to an exterior of the housing such that the portion of the condenser pipe is exposed to an ambient environment.

17. The power and fiber splice enclosure of claim 16, wherein the condenser pipe is configured such that a liquid working fluid in the condenser pipe is heated by heat transfer from the heat sink block and is evaporated to form a gas, the gas travels through the condenser pipe to the portion of the condenser pipe where the gas is cooled by heat transfer to the ambient environment and condenses back to a liquid state, and the liquid working fluid flows back to the heat sink block.

* * * * *